(12) United States Patent
Baek et al.

(10) Patent No.: US 11,706,944 B2
(45) Date of Patent: Jul. 18, 2023

(54) DISPLAY DEVICE AND METHOD OF MANUFACTURING DISPLAY DEVICE

(71) Applicant: Samsung Display Co., Ltd., Yongin-si (KR)

(72) Inventors: Young Seok Baek, Hwaseong-si (KR); Chong Sup Chang, Hwaseong-si (KR); Hana Seo, Suwon-si (KR); Eui Kang Heo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 96 days.

(21) Appl. No.: 17/078,015

(22) Filed: Oct. 22, 2020

(65) Prior Publication Data
US 2021/0226166 A1 Jul. 22, 2021

(30) Foreign Application Priority Data

Jan. 20, 2020 (KR) .......................... 10-2020-0007361

(51) Int. Cl.
| | |
|---|---|
| *H01L 51/52* | (2006.01) |
| *H10K 50/844* | (2023.01) |
| *H10K 71/00* | (2023.01) |

(52) U.S. Cl.
CPC .......... *H10K 50/844* (2023.02); *H10K 71/00* (2023.02)

(58) Field of Classification Search
CPC .............. H01L 27/3262; H01L 27/3258; H01L 51/0023; H01L 51/5203; H01L 51/5253; H01L 51/56
See application file for complete search history.

(56) References Cited

U.S. PATENT DOCUMENTS

| | | | |
|---|---|---|---|
| 6,444,565 B1* | 9/2002 | Feild | H01L 23/5226 257/E21.589 |
| 8,969,735 B2 | 3/2015 | Chow et al. | |
| 9,876,040 B1* | 1/2018 | Zhang | H01L 29/66757 |
| 2004/0135166 A1* | 7/2004 | Yamada | H01L 33/42 257/E33.068 |
| 2007/0001311 A1* | 1/2007 | Enda | H01L 21/76802 257/763 |
| 2010/0320457 A1* | 12/2010 | Matsubara | H01L 29/7869 257/E21.409 |
| 2015/0378061 A1* | 12/2015 | Lee | G02B 5/201 345/173 |
| 2021/0119007 A1* | 4/2021 | Misaki | G02F 1/1368 |

FOREIGN PATENT DOCUMENTS

KR   10-2018-0119718 A   11/2018

* cited by examiner

*Primary Examiner* — Caridad Everhart
(74) *Attorney, Agent, or Firm* — Lewis Roca Rothgerber Christie LLP (57) ABSTRACT

A method of manufacturing a display device may include sequentially forming a first conductive layer, a second conductive layer including copper (Cu), a third conductive layer, and a fourth conductive layer on a substrate, patterning the first conductive layer, the second conductive layer, the third conductive layer, and the fourth conductive layer together to form a conductive pattern including a first layer, a second layer, a third layer, and a fourth layer sequentially on the substrate, removing the fourth layer of the conductive pattern, forming a protective layer covering at least a sidewall of the conductive layer on the substrate, and forming a display element on the protective layer.

20 Claims, 12 Drawing Sheets

DISPLAY DEVICE AND METHOD OF MANUFACTURING DISPLAY DEVICE

CROSS-REFERENCE TO RELATED APPLICATION(S)

This application claims priority to and the benefit of Korean Patent Application No. 10-2020-0007361 filed on Jan. 20, 2020 in the Korean Intellectual Property Office (KIPO), the entire content of which is hereby incorporated by reference.

BACKGROUND

1. Field

Embodiments of the present disclosure relate to a method of manufacturing a display device.

2. Description of the Related Art

Recently, a display device such as a liquid crystal display device, an organic light emitting display device, and/or the like is widely being used. The display device may include a conductive pattern such as a wiring and/or the like to transmit signals, power, and/or the like. The conductive pattern may be formed as a multilayer structure that includes a plurality of layers including materials different from each other.

SUMMARY

Embodiments of the present disclosure provide a method of manufacturing a display device that prevent or reduce damage to a conductive pattern of the display device.

Embodiments of the present disclosure provide a display device having an improved reliability.

A method of manufacturing a display device according to an embodiment may include sequentially forming a first conductive layer, a second conductive layer including copper (Cu), a third conductive layer, and a fourth conductive layer on a substrate, patterning each of the first conductive layer, the second conductive layer, the third conductive layer, and the fourth conductive layer to form a conductive pattern including a first layer, a second layer, a third layer, and a fourth layer sequentially on the substrate, removing the fourth layer of the conductive pattern, forming a protective layer covering at least a sidewall of the conductive pattern on the substrate, and forming a display element on the protective layer.

In an embodiment, the patterning of each of the first conductive layer, the second conductive layer, the third conductive layer, and the fourth conductive layer may include forming a photoresist pattern on the fourth conductive layer, etching each of the first conductive layer, the second conductive layer, the third conductive layer, and the fourth conductive layer with an etchant using the photoresist pattern as an etching mask, and stripping the photoresist pattern.

In an embodiment, an etching rate of the third conductive layer with the etchant may be less than an etching rate of the second conductive layer with the etchant and an etching rate of the fourth conductive layer with the etchant.

In an embodiment, a sidewall of the third layer of the conductive pattern may not protrude from a sidewall of the second layer of the conductive pattern and a sidewall of the fourth layer of the conductive pattern.

In an embodiment, the fourth layer of the conductive pattern may be removed by a wet etching process.

In an embodiment, the fourth layer of the conductive pattern may be removed by a chemical mechanical polishing/planarization.

In an embodiment, a portion of the protective layer covering the sidewall of the conductive pattern may have an opening.

In an embodiment, the protective layer may have an opening exposing an upper surface of the conductive pattern, and forming the display element may include forming an electrode layer that extends through the opening of the protective layer on the protective layer and patterning the electrode layer with an etchant to form a pixel electrode.

In an embodiment, the third layer of the conductive pattern may not be etched by the etchant.

In an embodiment, the first conductive layer may include titanium (Ti).

In an embodiment, the third conductive layer may include titanium (Ti).

In an embodiment, the fourth conductive layer may include copper (Cu).

In an embodiment, a thickness of the second conductive layer may be in a range from about 10000 Å to about 12000 Å.

A display device according to an embodiment may include a substrate, a conductive pattern including a first layer, a second layer including copper (Cu), and a third layer sequentially on the substrate, a protective layer on the conductive pattern, and a display element on the protective layer. The third layer may not protrude from the second layer at a sidewall of the conductive pattern.

In an embodiment, the first layer of the conductive pattern may include titanium (Ti).

In an embodiment, the third layer of the conductive pattern may include titanium (Ti).

In an embodiment, a thickness of the second layer of the conductive pattern may be in a range from about 10000 Å to about 12000 Å.

In an embodiment, the protective layer may cover a sidewall of the conductive pattern, and a portion of the protective layer covering at least the sidewall of the conductive pattern may have an opening.

In an embodiment, a transistor providing a driving current to the display element may be between the substrate and the protective layer, and the conductive pattern may be a source electrode or a drain electrode of the transistor.

In an embodiment, a transistor providing a driving current to the display element may be between the substrate and the protective layer, and the conductive pattern may be a pad electrically coupled to a flexible printed circuit to provide a signal or a power to the transistor.

In the method of manufacturing the display device according to the embodiments, the fourth layer of the conductive pattern may be removed after patterning the first to fourth conductive layer sequentially formed to form the conductive pattern including the first to fourth layers and before forming the protective layer covering the sidewall of the conductive pattern, so that it is possible to prevent or reduce damage to the second layer of the conductive pattern while the fourth layer of the conductive pattern is etched by the etchant when the pixel electrode is formed on the protective layer in a following process.

The display device according to embodiments may include the conductive pattern including the first layer, the second layer, and the third layer sequentially stacked, and the sidewall of the third layer of the conductive pattern may not protrude from the sidewall of the second layer of the conductive pattern, so that damage of the display device due to a tip of the conductive pattern may be minimized or reduced, and the display device having an improved reliability may be provided.

BRIEF DESCRIPTION OF THE DRAWINGS

Illustrative, non-limiting embodiments of the present disclosure will be more clearly understood from the following detailed description taken in conjunction with the accompanying drawings.

DETAILED DESCRIPTION

Hereinafter, display devices and methods of manufacturing display devices in accordance with embodiments will be explained in more detail with reference to the accompanying drawings.

Figure 1:
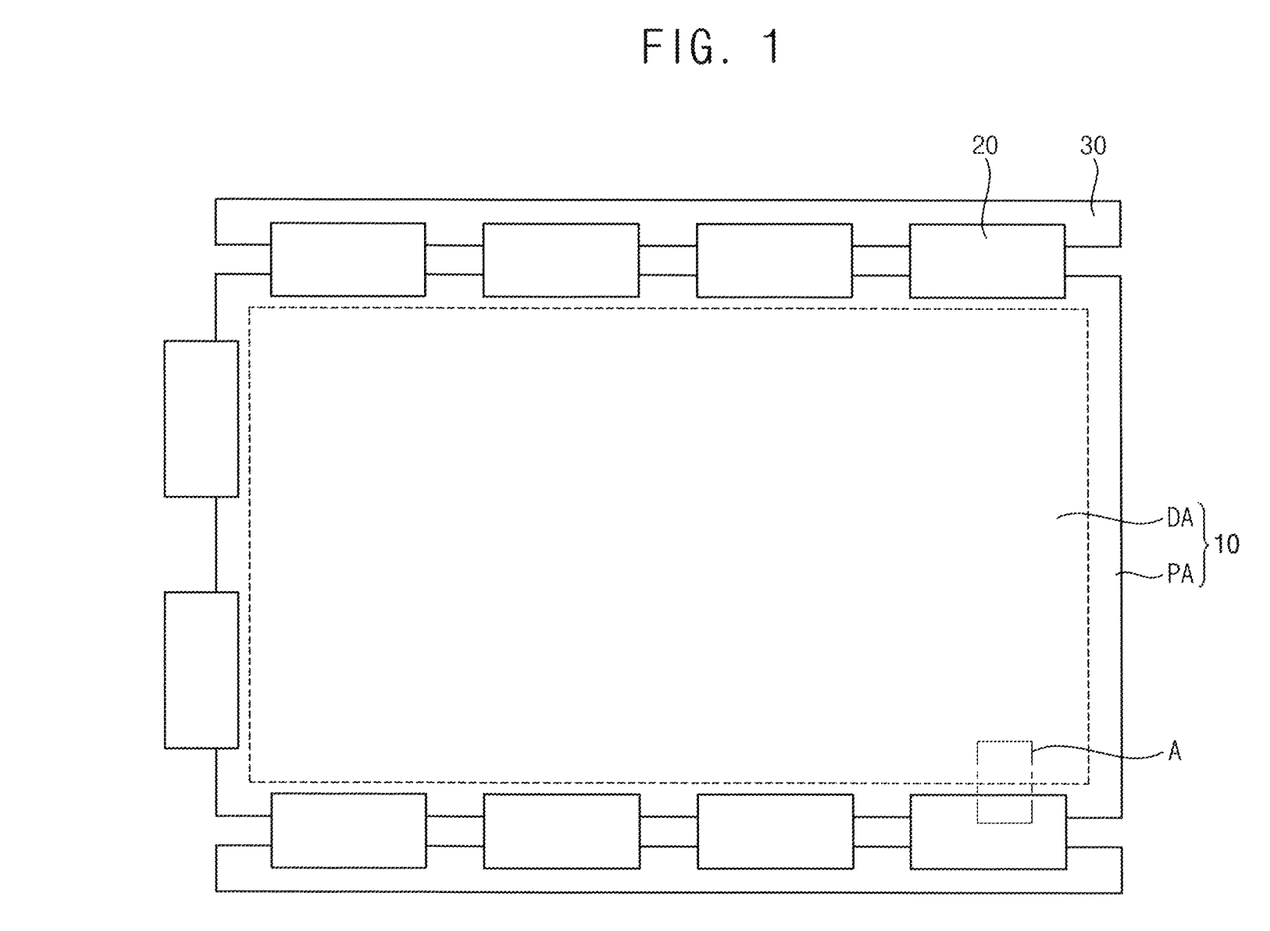
FIG. 1 is a plan view illustrating a display device according to an embodiment.
Figure 2:
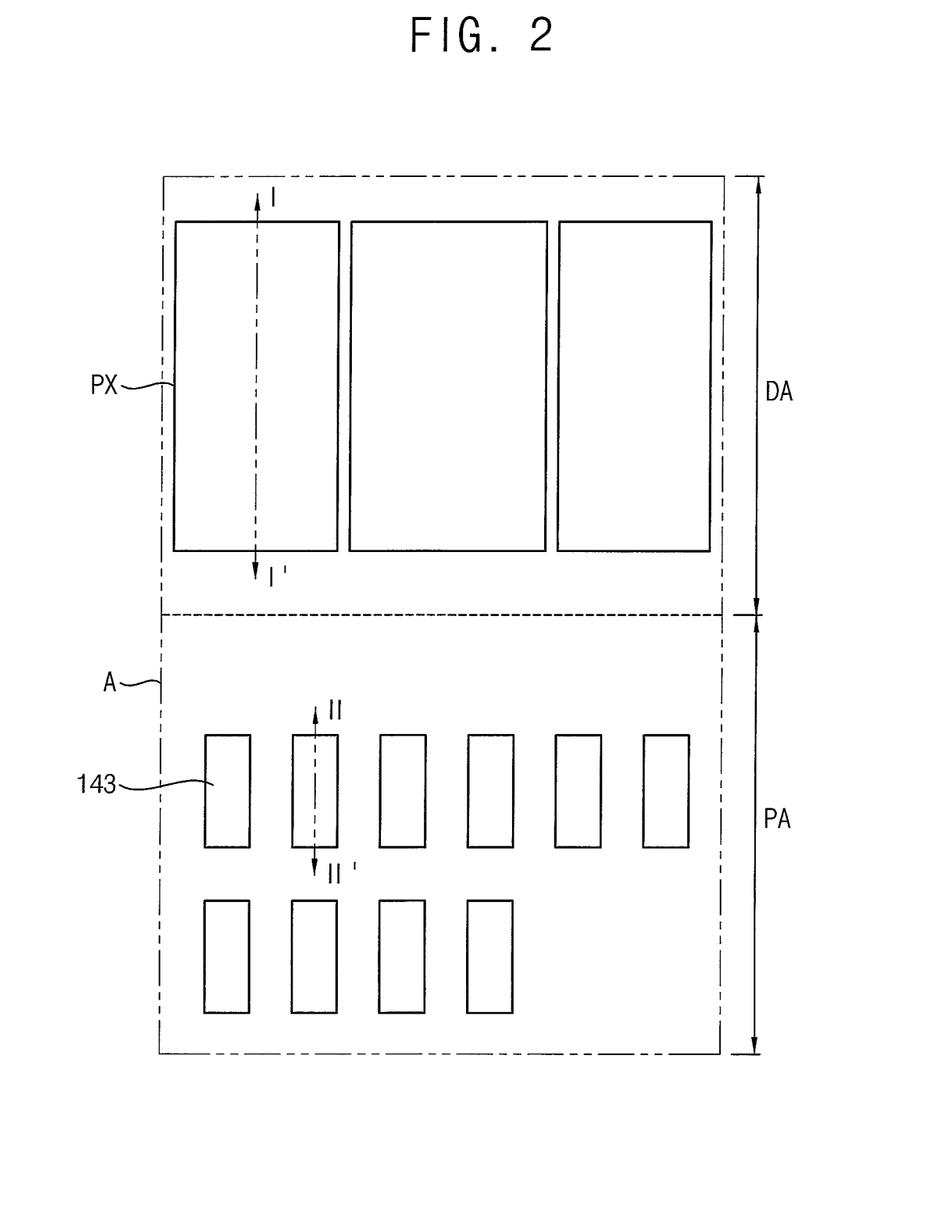
FIG. 2 is a plan view illustrating a portion of a display panel in FIG. 1.

FIG. 1 is a plan view illustrating a display device according to an embodiment. FIG. 2 is a plan view illustrating a portion A of a display panel in FIG. 1.

Referring to FIGS. 1 and 2, a display device according to an embodiment may include a display panel 10, a flexible printed circuit (FPC) 20, and a printed circuit board (PCB) 30. The PCB 30 may be adjacent to the display panel 10 and may be coupled to the display panel 10 by the FPC 20.

The display panel 10 may include a display area DA and a peripheral area PA. A plurality of pixels PX may be in the display area DA. The display area DA may display an image formed by light emitted from one or more of the pixels PX.

The peripheral area PA may be adjacent to the display area DA. In an embodiment, the peripheral area PA may surround (e.g., completely surround) the display area DA. A plurality of pads 143 providing signals, power, etc. to the pixels PX may be in the peripheral area PA. The peripheral area PA may be a non-display area that is designed not to display an image.

The FPC 20 may be coupled to the peripheral area PA of the display panel 10. The FPC 20 may be coupled to the peripheral area PA of the display panel 10 through the pads 143 of the display panel 10. For example, the FPC 20 may be electrically coupled to the pads 143 of the display panel 10 through an anisotropic conductive film (ACF). The FPC 20 may couple the display panel 10 and the PCB 30, and may transmit the signals, the power, etc. from the PCB 30 to the display panel 10. In an embodiment, the display device may include a plurality of FPCs 20.

The PCB 30 may be coupled to the FPC 20. In an embodiment, the PCB 30 may be coupled to a plurality of FPCs 20. A control unit (e.g., a controller) for generating the signals, the power, etc. and/or an input unit (e.g., an input device) for receiving the signals, the power, etc. may be in the PCB 30.

Figure 3:
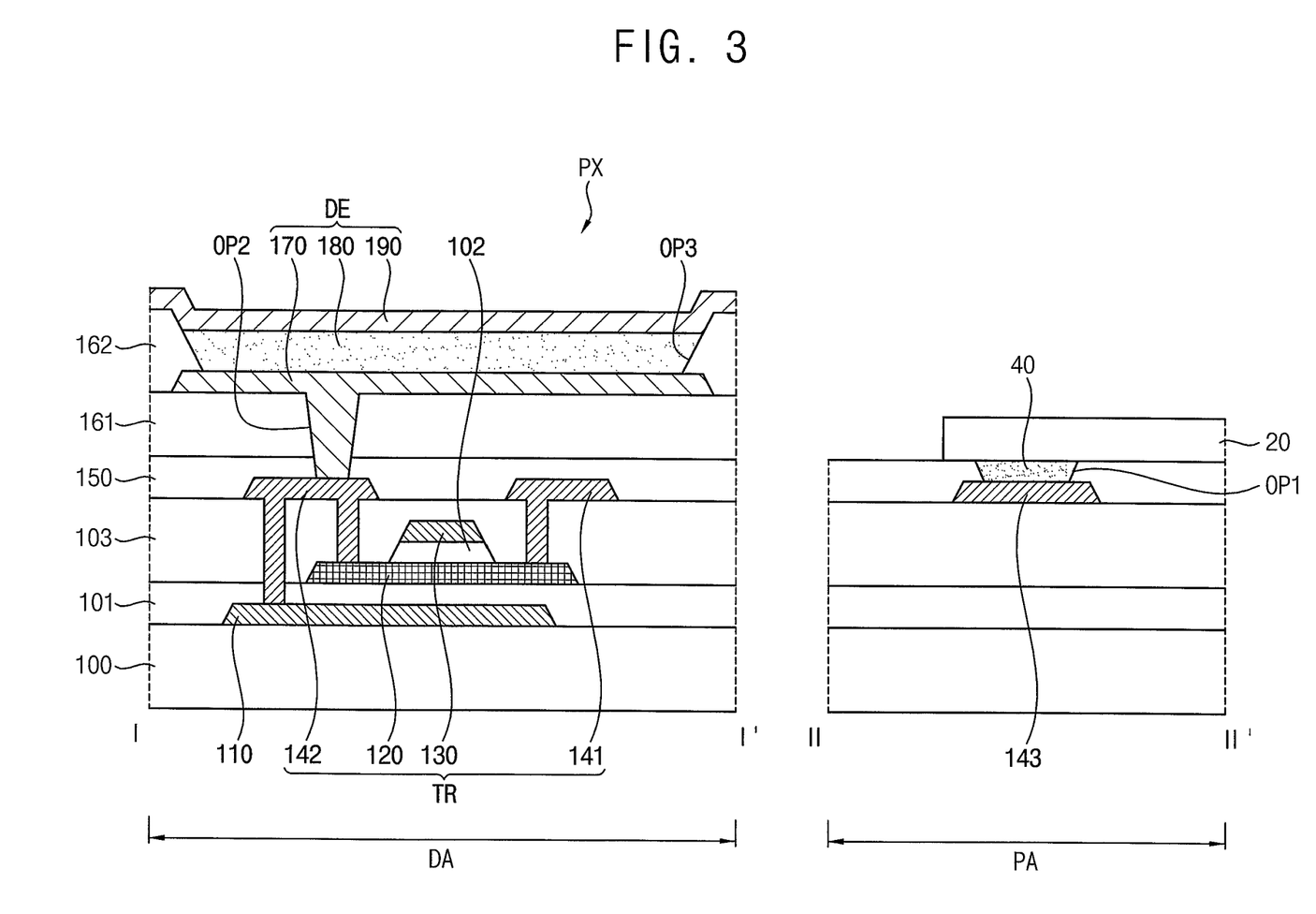
FIG. 3 is a cross-sectional view taken along a line I-I' and a line II-II' in FIG. 2.

FIG. 3 is a cross-sectional view taken along a line I-I' and a line II-II' in FIG. 2.

Referring to FIG. 3, the pixel PX in the display area DA may include a transistor TR and a display element DE. The transistor TR may provide a driving current to the display element DE, and the display element DE may emit light based on the driving current. The transistor TR may include an active layer 120, a gate electrode 130, a first electrode 141, and a second electrode 142. The display element DE may include a pixel electrode 170, an emission layer 180, and an opposite electrode 190.

A substrate 100 may be a transparent insulating substrate. For example, the substrate 100 may be formed of glass, quartz, plastic, and/or the like.

A lower electrode 110 may be on the substrate 100. The lower electrode 110 may be positioned in the display area DA. The lower electrode 110 may prevent or reduce permeation of external light, impurities, etc. into the active layer 120 through the substrate 100. Further, when a voltage is applied to the lower electrode 110, the lower electrode 110 may function as a lower gate electrode of the transistor TR. For example, the lower electrode 110 may be electrically coupled to the second electrode 142 of the transistor TR. In such an example, a threshold voltage of the transistor TR may be controlled, and thus, hysteresis characteristics of the transistor TR may be improved (e.g., hysteresis may be reduced). The lower electrode 110 may include a conductive material such as molybdenum (Mo), copper (Cu), titanium (Ti), and/or the like. The lower electrode 110 may have a single-layer structure or a multilayer structure.

A buffer layer 101 may be on the lower electrode 110. The buffer layer 101 may be on the substrate 100 to cover the lower electrode 110. The buffer layer 101 may extend to the peripheral area PA from the display area DA. The buffer layer 101 may prevent or reduce permeation of impurities through the substrate 100. Further, the buffer layer 101 may provide a planarized surface above the substrate 100. The buffer layer 101 may include an inorganic insulating material such as silicon nitride, silicon oxide, silicon oxynitride, and/or the like.

The active layer 120 may be on the buffer layer 101. The active layer 120 may overlap at least a portion of the lower electrode 110. In an embodiment, the active layer 120 may include amorphous silicon, polycrystalline silicon, and/or the like. In another embodiment, the active layer 120 may include an oxide semiconductor, metal oxide, and/or the like. The active layer 120 may include a source region, a drain region, and a channel region therebetween. Each of the source region and the drain region may be doped with P-type impurities or N-type impurities.

A gate insulation layer 102 may be on the active layer 120. In an embodiment, the gate insulation layer 102 may overlap the channel region of the active layer 120, and may not cover the source region and the drain region of the active layer 120 (e.g., the gate insulation layer 102 may cover only the channel region of the active layer 120). The gate insulation layer 102 may insulate the gate electrode 130 from the active layer 120. The gate insulation layer 102 may include an inorganic insulating material such as silicon nitride, silicon oxide, silicon oxynitride, and/or the like.

The gate electrode 130 may be on the gate insulation layer 102. The gate electrode 130 may be on the channel region of the active layer 120 with the gate insulation layer 102 therebetween. The gate electrode 130 may include a conductive material such as molybdenum (Mo), copper (Cu), titanium (Ti), and/or the like. The gate electrode 130 may have a single-layer structure or a multilayer structure.

An insulation interlayer 103 may be on the gate electrode 130. In an embodiment, the insulation interlayer 103 may be on the buffer layer 101 to cover the active layer 120 and the gate electrode 130. The insulation interlayer 103 may insulate the first electrode 141 and the second electrode 142 from the gate electrode 130. Because the gate insulation layer 102 does not cover the source region and the drain region of the active layer 120, the insulation interlayer 103 may directly contact (e.g., physically contact) both the source region and the drain region of the active layer 120. Accordingly, hydrogen atoms may diffuse from the insulation interlayer 103 to the source region and the drain region of the active layer 120, so that the source region and the drain region of the active layer 120 may become conductive (e.g., electrically conductive). The insulation interlayer 103 may extend from the display area DA to the peripheral area PA (as shown in, for example, FIG. 3).

The first electrode 141 and the second electrode 142 may be on the insulation interlayer 103. The first electrode 141 and the second electrode 142 may be positioned in the display area DA. Each of the first electrode 141 and the second electrode 142 may have a multilayer structure.

In an embodiment, one of the first electrode 141 and the second electrode 142 may be a source electrode of the transistor TR, and the other of the first electrode 141 and the second electrode 142 may be a drain electrode of the transistor TR. The source electrode and the drain electrode of the transistor TR may be coupled to the source region and the drain region of the active layer 120, respectively. In an embodiment, the second electrode 142 may be coupled to the lower electrode 110.

The pad 143 may be on the insulation interlayer 103. The pad 143 may be positioned in the peripheral area PA. The pad 143 may be coupled to the transistor TR through a wiring to provide signals, power, and/or the like to the transistor TR. The pad 143 may have a multilayer structure.

A protective layer 150 may be on the first electrode 141, the second electrode 142, and the pad 143. The protective layer 150 may be on the insulation interlayer 103 to cover the first electrode 141, the second electrode 142, and the pad 143. The protective layer 150 may protect the transistor TR and the pad 143. The protective layer 150 may extend from the display area DA to the peripheral area PA. The protective layer 150 may include an inorganic insulating material such as silicon nitride, silicon oxide, silicon oxynitride, and/or the like.

A first opening OP1 exposing at least a portion of an upper surface of the pad 143 may be formed in the protective layer 150. In an embodiment, the first opening OP1 may expose a central portion of the upper surface of the pad 143, and the protective layer 150 may cover a sidewall of the pad 143 and a side portion of the upper surface of the pad 143.

A planarization layer 161 may be on the protective layer 150. The planarization layer 161 may provide a planarized surface over the transistor TR. The planarization layer 161 may include an organic insulating material such as polyimide (PI) and/or the like. The planarization layer 161 may be positioned in the display area DA. The planarization layer 161 may not be positioned in the peripheral area PA. For example, in some embodiments, the planarization layer 161 does not extend into the peripheral area PA. Thus, in some embodiments, the peripheral area PA is free of the planarization layer 161.

A second opening OP2 exposing at least a portion of an upper surface of the second electrode 142 may be formed in the protective layer 150 and the planarization layer 161. In an embodiment, the second opening OP2 may expose a central portion of the upper surface of the second electrode 142, and the protective layer 150 may cover a sidewall of the second electrode 142 and a side portion of the upper surface of the second electrode 142.

The pixel electrode 170 may be on the planarization layer 161. The pixel electrode 170 may fill (e.g., may extend through) the second opening OP2, and may be coupled to the second electrode 142 of the transistor TR through the second opening OP2. The pixel electrode 170 may include a conductive material such as metal, transparent conductive oxide, and/or the like. For example, the pixel electrode 170 may include silver (Ag), indium tin oxide (ITO), and/or the like.

A pixel defining layer 162 may be on the pixel electrode 170. The pixel defining layer 162 may be on the planarization layer 161 to cover the pixel electrode 170. The pixel defining layer 162 may be positioned in the display area DA. The pixel defining layer 162 may not be positioned in the peripheral area PA. The pixel defining layer 162 may include an organic insulating material such as polyimide (PI) and/or the like.

A third opening OP3 exposing at least a portion of an upper surface of the pixel electrode 170 may be formed in the pixel defining layer 162. In an embodiment, the third opening OP3 may expose a central portion of the upper surface of the pixel electrode 170, and the pixel defining layer 162 may cover a sidewall of the pixel electrode 170 and a side portion of the upper surface of the pixel electrode 170.

The emission layer 180 may be in the third opening OP3 on the pixel electrode 170. The emission layer 180 may include at least one of an organic light emitting material and a quantum dot. For example, the emission layer 180 may include the organic light emitting material and/or the quantum dot In an embodiment, the organic light emitting material may include a low molecular organic compound (e.g., a low molecular weight organic compound) or a high molecular organic compound (e.g., a high molecular weight organic compound). For example, the low molecular organic compound may include copper phthalocyanine, diphenylbenzidine (N, N'-diphenylbenzidine), trihydroxyquinoline aluminum (tris-(8-hydroxyquinoline)aluminum), and/or the like. The high molecular organic compound may include poly ethylenedioxythiophene (poly(3,4-ethylenedioxythiophene), polyaniline, polyphenylenevinylene, polyfluorene, and/or the like.

In an embodiment, the quantum dot may include a core including a group II-VI compound, a group III-V compound, a group IV-VI compound, a group IV element, a group IV compound, or a combination thereof. In one embodiment, the quantum dot can have a core-shell structure including a core and a shell surrounding the core. The shell may prevent or reduce chemical denaturation of the core, thereby serving as a protective layer for maintaining semiconductor characteristics and a charging layer for imparting electrophoretic characteristics to the quantum dot.

The opposite electrode 190 may be on the emission layer 180. The opposite electrode 190 may be on the pixel defining layer 162 to cover the emission layer 180. The opposite electrode 190 may include a conductive material such as a metal, a transparent conductive oxide, and/or the like. For example, the opposite electrode 190 may include aluminum (Al), platinum (Pt), silver (Ag), magnesium (Mg), gold (Au), chromium (Cr), tungsten (W), titanium (Ti), and/or the like.

The FPC 20 may be on the pad 143. The FPC 20 may be electrically coupled to the pad 143 through an anisotropic conductive film 40 filling (e.g., extending through) the first opening OP1.

Figure 4:
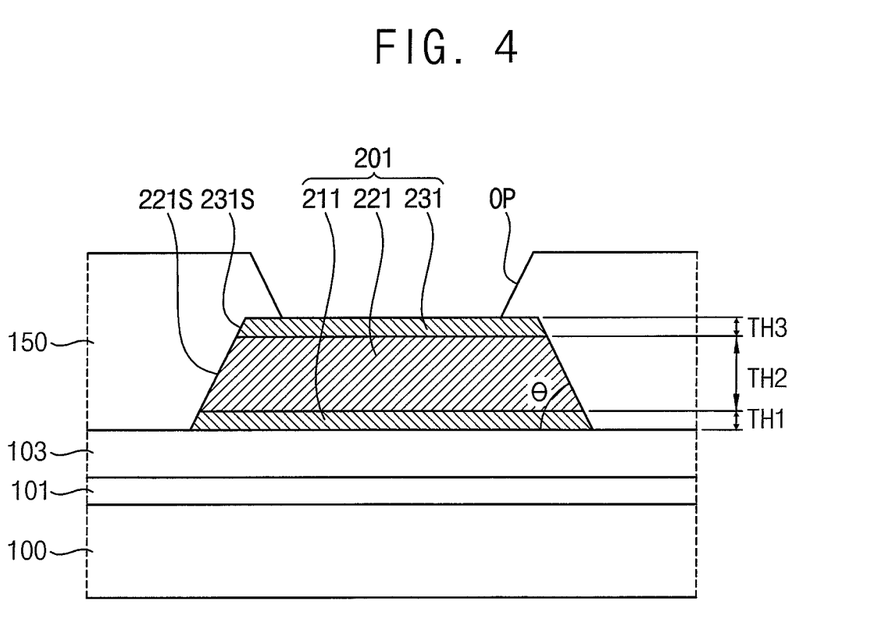
FIG. 4 is a cross-sectional view illustrating a portion of a display panel in FIG. 1.

FIG. 4 is a cross-sectional view illustrating a portion of the display panel 10 in FIG. 1.

Referring to FIG. 4, the display device may include a conductive pattern 201 on the substrate 100 and the protective layer 150 on the conductive pattern 201. As used herein, the term "conductive pattern" may refer to a patterned layer that is electrically conductive. The protective layer 150 may include an opening OP exposing an upper surface of the conductive pattern 201. In an embodiment, the conductive pattern 201 may be the pad 143 illustrated in FIG. 3. In such an embodiment, the opening OP of the protective layer 150 may be the first opening OP1 illustrated in FIG. 3. In another embodiment, the conductive pattern 201 may be the second electrode 142 illustrated in FIG. 3. In such an embodiment, the opening OP of the protective layer 150 may be the second opening OP2 illustrated in FIG. 3.

The conductive pattern 201 may have a multilayer structure including a plurality of layers. The conductive pattern 201 may include a first layer 211, a second layer 221, and a third layer 231 sequentially on the substrate 100. For example, the first layer 211 may be on the insulation interlayer 103, the second layer 221 may be on the first layer 211, and the third layer 231 may be on the second layer 221.

The first layer 211 of the conductive pattern 201 may include titanium (Ti). A thickness TH1 of the first layer 211 of the conductive pattern 201 may be less than a thickness TH2 of the second layer 221 of the conductive pattern 201. In an embodiment, the thickness TH1 of the first layer 211 of the conductive pattern 201 may be in a range from about 150 Å to about 250 Å. The first layer 211 of the conductive pattern 201 may serve to protect a lower surface of the second layer 221 of the conductive pattern 201.

The second layer 221 of the conductive pattern 201 may include copper (Cu). The thickness TH2 of the second layer 221 of the conductive pattern 201 may be greater than the thickness TH1 of the first layer 211 of the conductive pattern 201 and a thickness TH3 of the third layer 231 of the conductive pattern 201. Accordingly, the second layer 221 of the conductive pattern 201 may serve as a main conductive layer transmitting signals, power, and/or the like.

In an embodiment, the thickness TH2 of the second layer 221 of the conductive pattern 201 may be in a range from about 10000 Å to about 12000 Å. When the thickness TH2 of the second layer 221 of the conductive pattern 201 is less than about 10000 Å, signal delay may occur due to the increase of a resistance (e.g., sheet resistance) of the conductive pattern 201. Further, when the thickness TH2 of the second layer 221 of the conductive pattern 201 is greater than about 12000 Å, reliability of elements of the display device formed on the conductive pattern 201 may be reduced due to the increase of a step portion by the conductive pattern 201 (e.g., the conductive pattern may form an undesirably large step).

The third layer 231 of the conductive pattern 201 may include titanium (Ti). The thickness TH3 of the third layer 231 of the conductive pattern 201 may be less than the thickness TH2 of the second layer 221 of the conductive pattern 201. In an embodiment, the thickness TH3 of the third layer 231 of the conductive pattern 201 may be in a range from about 200 Å to about 300 Å. The third layer 231 of the conductive pattern 201 may serve to protect an upper surface of the second layer 221 of the conductive pattern 201.

A sidewall 231S of the third layer 231 of the conductive pattern 201 may not protrude from a sidewall 221S of the second layer 221 of the conductive pattern 201. In other words, a tip may not be formed in the conductive pattern 201. Because the sidewall 231S of the third layer 231 of the conductive pattern 201 does not protrude from the sidewall 221S of the second layer 221 of the conductive pattern 201, damage of the display device due to the tip of the conductive pattern 201 may be minimized or reduced, and the display device having an improved reliability may be provided.

In an embodiment, the sidewall 231S of the third layer 231 of the conductive pattern 201 may contact (e.g., physically contact) the sidewall 221S of the second layer 221 of the conductive pattern 201. In other words, the sidewall 221S of the second layer 221 of the conductive pattern 201 and the sidewall 231S of the third layer 231 of the conductive pattern 201 may be adjacent to each other.

In an embodiment, a sidewall of the conductive pattern 201 may form an acute angle ($\Theta$) with respect to a lower surface of the conductive pattern 201. In other words, an angle ($\Theta$) of the sidewall of the conductive pattern 201 with respect to the lower surface of the conductive pattern 201 may be greater than 0 degrees and less than 90 degrees. For example, the angle ($\Theta$) of the sidewall of the conductive pattern 201 with respect to the lower surface of the conductive pattern 201 may be in a range from about 60 degrees to about 70 degrees.

The protective layer 150 may cover the sidewall of the conductive pattern 201. A lower surface of a portion of the protective layer 150 covering the sidewall of the conductive pattern 201 may contact (e.g., physically contact) an upper surface of the third layer 231 of the conductive pattern 201. In other words, a space through which materials are permeated from the outside may not exist between the lower surface of the portion of the protective layer 150 covering the sidewall of the conductive pattern 201 and the upper surface of the third layer 231 of the conductive pattern 201.

FIGS. 5, 6, 7, 8, 9, 10, 11, and 12 are cross-sectional views illustrating a method of manufacturing a display device according to an embodiment. For example, FIGS. 5 to 12 may illustrate an embodiment of a method of manufacturing the display device described with reference to FIGS. 3 and 4.

Figure 5:
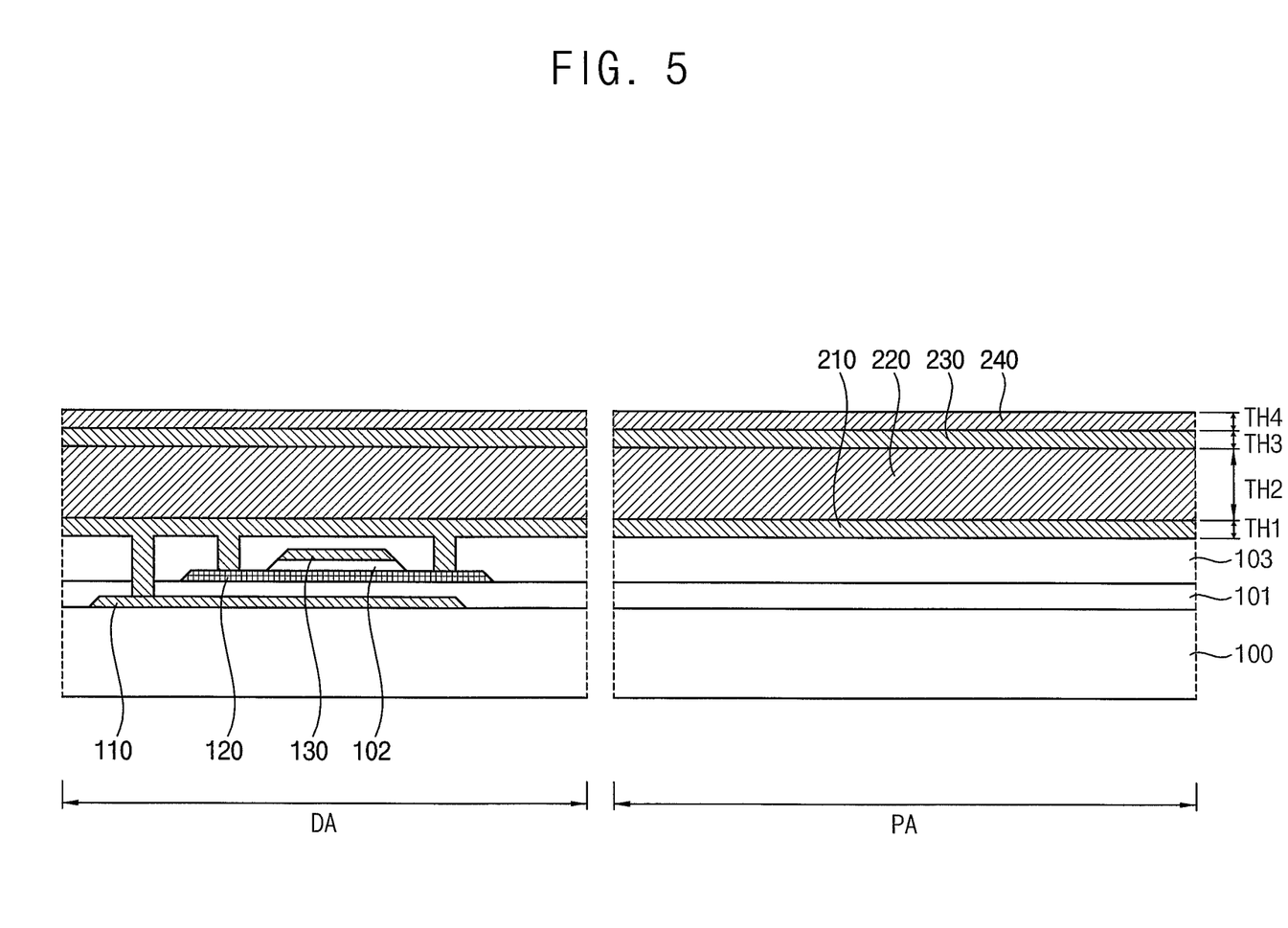
FIGS. 5, 6, 7, 8, 9, 10, 11, and 12 are cross-sectional views illustrating a method of manufacturing a display device according to an embodiment.

Referring to FIG. 5, a first conductive layer 210, a second conductive layer 220, a third conductive layer 230, and a fourth conductive layer 240 may be sequentially formed on the substrate 100.

First, the first conductive layer 210 may be formed on the insulation interlayer 103 in the display area DA and the peripheral area PA. The first conductive layer 210 may include titanium (Ti), and may be formed to have a thickness TH1 in a range of about 150 Å to about 250 Å.

Then, the second conductive layer 220 may be formed on the first conductive layer 210. The second conductive layer 220 may include copper (Cu), and may be formed to have a thickness TH2 in a range of about 10000 Å to about 12000 Å. The thickness TH2 of the second conductive layer 220 may be greater than the thickness TH1 of the first conductive layer 210.

Then, the third conductive layer 230 may be formed on the second conductive layer 220. The third conductive layer 230 may include titanium (Ti), and may be formed to have a thickness TH3 in a range of about 200 Å to about 300 Å. The thickness TH3 of the third conductive layer 230 may be less than the thickness TH2 of the second conductive layer 220.

Then, the fourth conductive layer 240 may be formed on the third conductive layer 230. The fourth conductive layer 240 may include copper (Cu), and may be formed to have a thickness TH4 in a range of about 50 Å to about 150 Å.

Figure 6:
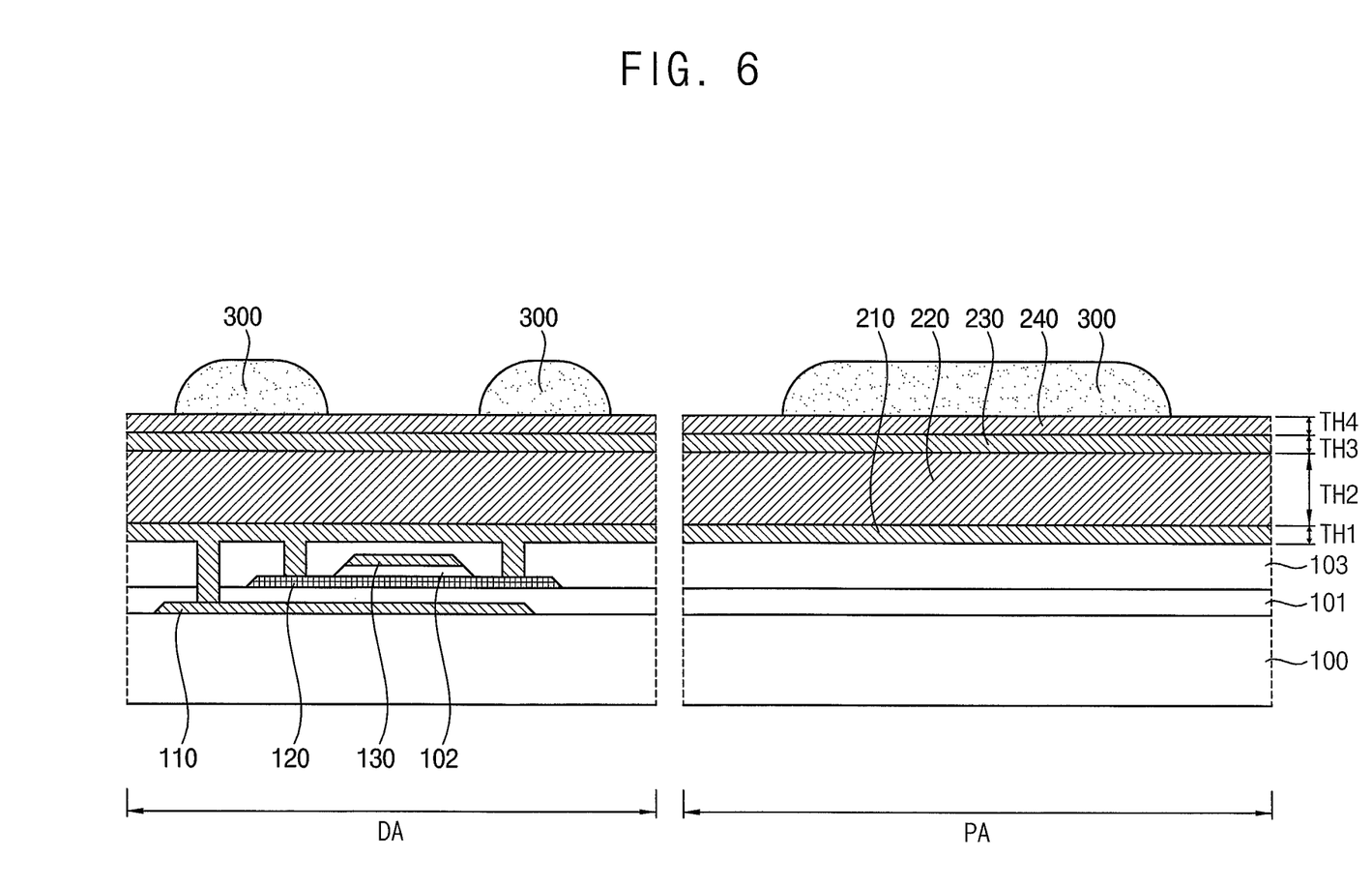
Figure 7:
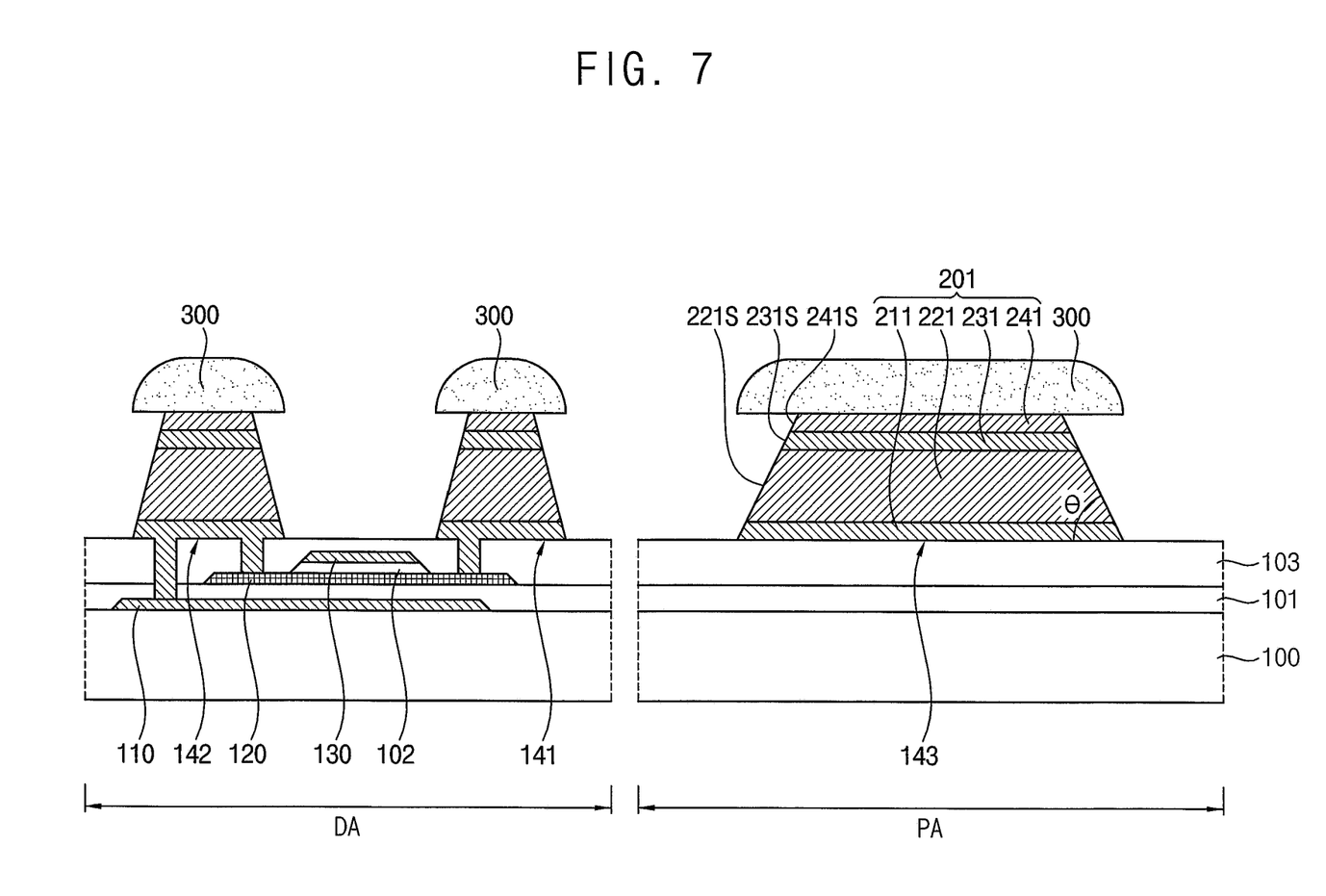
Figure 8:
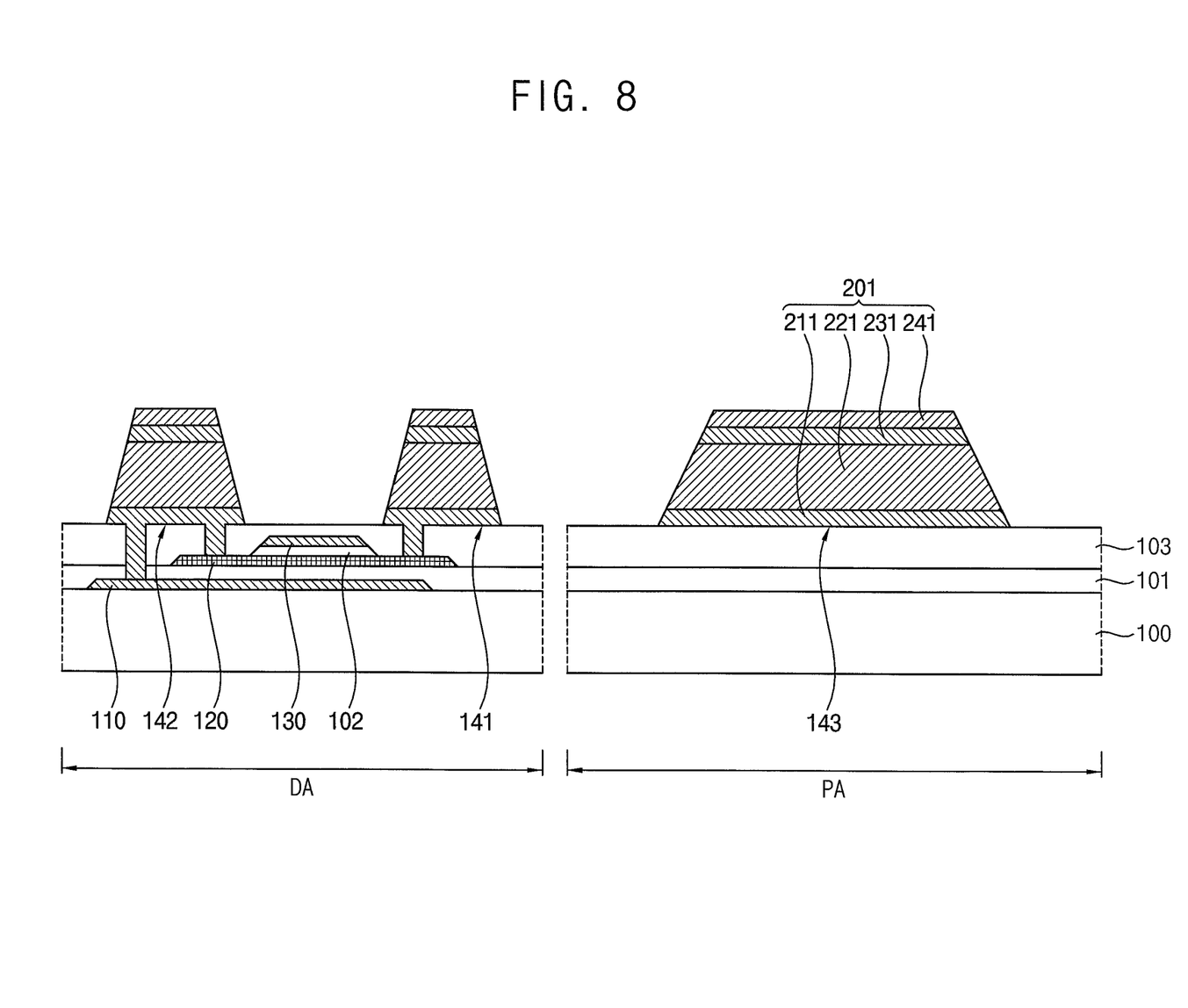

Referring to FIGS. 6, 7, and 8, the first conductive layer 210, the second conductive layer 220, the third conductive layer 230, and the fourth conductive layer 240 may be patterned together to form the conductive pattern 201 including a first layer 211, a second layer 221, a third layer 231, and a fourth layer 241 that are sequentially on the substrate 100. Here, the conductive pattern 201 may be the pad 143 and/or the second electrode 142.

First, a photoresist pattern 300 may be formed on the fourth conductive layer 240. For example, a photoresist layer may be formed on the fourth conductive layer 240, and the photoresist layer may be exposed and developed using a photo mask to form the photoresist pattern 300. The photoresist pattern 300 may be positioned on the fourth conductive layer 240 to correspond to a portion in which the conductive pattern 201 is formed.

Then, the first conductive layer 210, the second conductive layer 220, the third conductive layer 230, and the fourth conductive layer 240 may be etched together using the photoresist pattern 300 as an etching mask. The first conductive layer 210, the second conductive layer 220, the third conductive layer 230, and the fourth conductive layer 240 may be etched by a wet etching process using an etchant. The first conductive layer 210 may be etched to form the first layer 211 of the conductive pattern 201, and the second conductive layer 220 may be etched to form the second layer 221 of the conductive pattern 201. The third conductive layer 230 may be etched to form the third layer 231 of the conductive pattern 201, and the fourth conductive layer 240 may be etched to form the fourth layer 241 of the conductive pattern 201.

A sidewall 231S of the third layer 231 of the conductive pattern 201 may not protrude from a sidewall 221S of the second layer 221 of the conductive pattern 201 and a sidewall 241S of the fourth layer 241 of the conductive pattern 201. In other words, a tip may not be formed in the conductive pattern 201.

In an embodiment, the sidewall 231S of the third layer 231 of the conductive pattern 201 may contact (e.g., physically contact) the sidewall 221S of the second layer 221 of the conductive pattern 201 and the sidewall 241S of the fourth layer 241 of the conductive pattern 201. In other words, the sidewall 221S of the second layer 221 of the conductive pattern 201, the sidewall 231S of the third layer 231 of the conductive pattern 201, and the sidewall 241S of the fourth layer 241 of the conductive pattern 201 may be adjacent to each other.

In an embodiment, a sidewall of the conductive pattern 201 may form an acute angle ($\Theta$) with respect to a lower surface of the conductive pattern 201. In other words, an angle ($\Theta$) of the sidewall of the conductive pattern 201 with respect to the lower surface of the conductive pattern 201 may be greater than 0 degree and less than 90 degrees. For example, the angle ($\Theta$) of the sidewall of the conductive pattern 201 with respect to the lower surface of the conductive pattern 201 may be in a range from about 60 degrees to about 70 degrees.

In an embodiment, an etching rate of the third conductive layer 230 with the etchant may be less than an etching rate of the second conductive layer 220 with the etchant and an etching rate of the fourth conductive layer 240 with the etchant. In other words, an etching rate of titanium (Ti) with the etchant may be less than an etching rate of copper (Cu) with the etchant.

Because an upper surface of the second conductive layer 220 contacts (e.g., physically contacts) a lower surface of the third conductive layer 230, and a lower surface of the fourth conductive layer 240 contacts (e.g., physically contacts) an upper surface of the third conductive layer 230, an area of the third conductive layer 230 contacting (e.g., physically contacting) the etchant may be greater than an area of the second conductive layer 220 contacting (e.g., physically contacting) the etchant and an area of the fourth conductive layer 240 contacting (e.g., physically contacting) the etchant. Accordingly, the second conductive layer 220, the third conductive layer 230, and the fourth conductive layer 240 may be etched by a uniform (e.g., substantially uniform) width although the etching rate of the second conductive layer 220 with the etchant and the etching rate of the fourth conductive layer 240 with the etchant are greater than the etching rate of the third conductive layer 230 with the etchant. Therefore, the sidewall 231S of the third layer 231 of the conductive pattern 201 may not protrude from the sidewall 221S of the second layer 221 of the conductive pattern 201 and the sidewall 241S of the fourth layer 241 of the conductive pattern 201. The fourth conductive layer 240 may serve to prevent or reduce formation of a tip in the conductive pattern 201 by increasing a contact area of the third conductive layer 230 to the etchant in the process of etching the first conductive layer 210, the second conductive layer 220, the third conductive layer 230, and the fourth conductive layer 240 together by using the etchant.

Then, the photoresist pattern 300 may be stripped. For example, the photoresist pattern 300 may be stripped from the conductive pattern 201 using a stripping solution.

Figure 9:
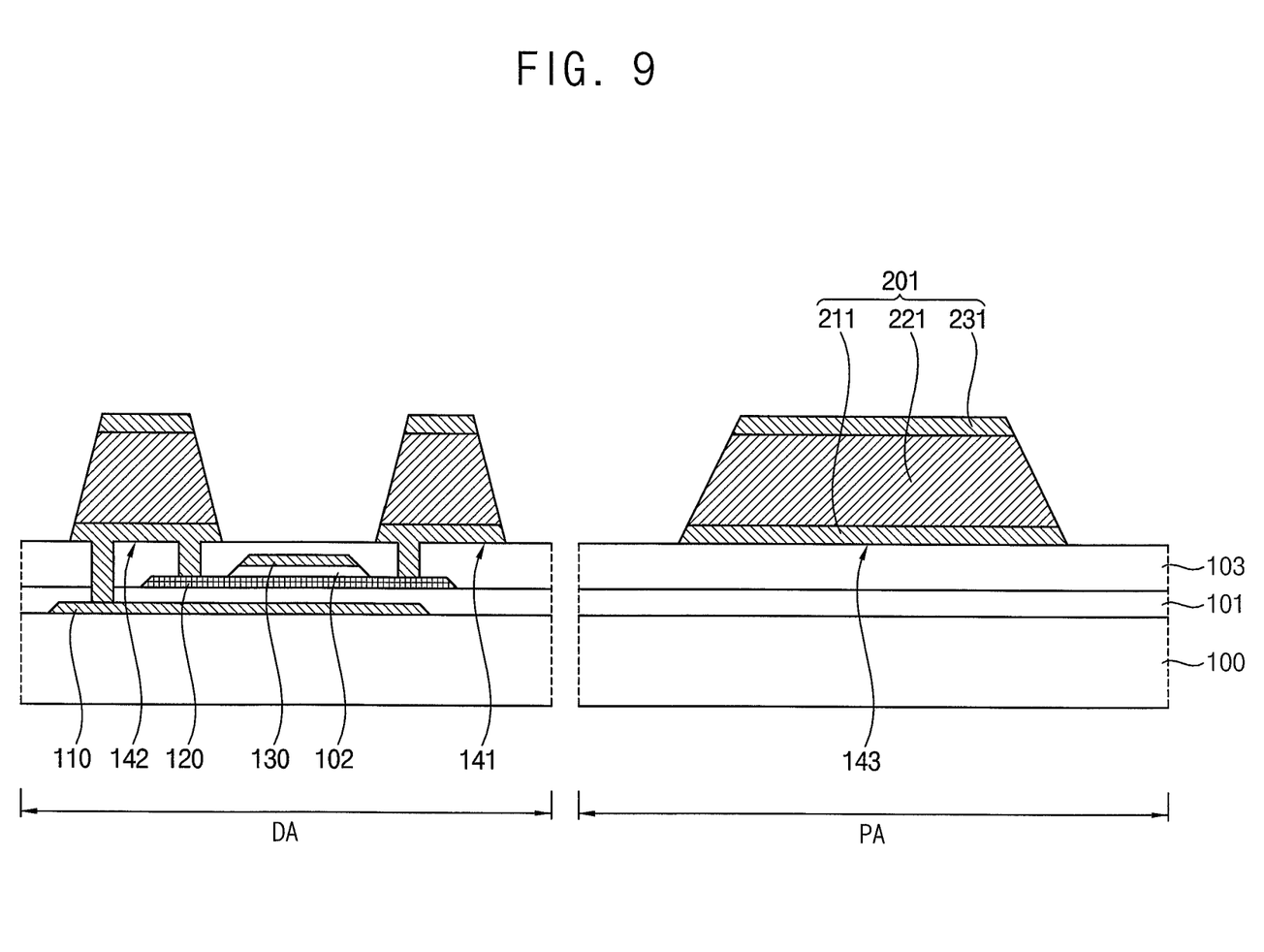

Referring to FIG. 9, the fourth layer 241 of the conductive pattern 201 may be removed.

In an embodiment, the fourth layer 241 of the conductive pattern 201 may be removed by a wet etching. For example, the fourth layer 241 of the conductive pattern 201 may be removed using an etchant capable of etching copper (Cu) and incapable of etching titanium (Ti).

In another embodiment, the fourth layer 241 of the conductive pattern 201 may be removed by a chemical mechanical polishing/planarizing (CMP) process. For example, the upper surface of the fourth layer 241 of the conductive pattern 201 may be chemically and mechanically polished using a polishing pad rotating in contact (e.g., physically contact) with the upper surface of the fourth layer 241 of the conductive pattern 201 and a slurry flowing between the polishing pad and the upper surface of the fourth layer 241 of the conductive pattern 201.

Figure 10:
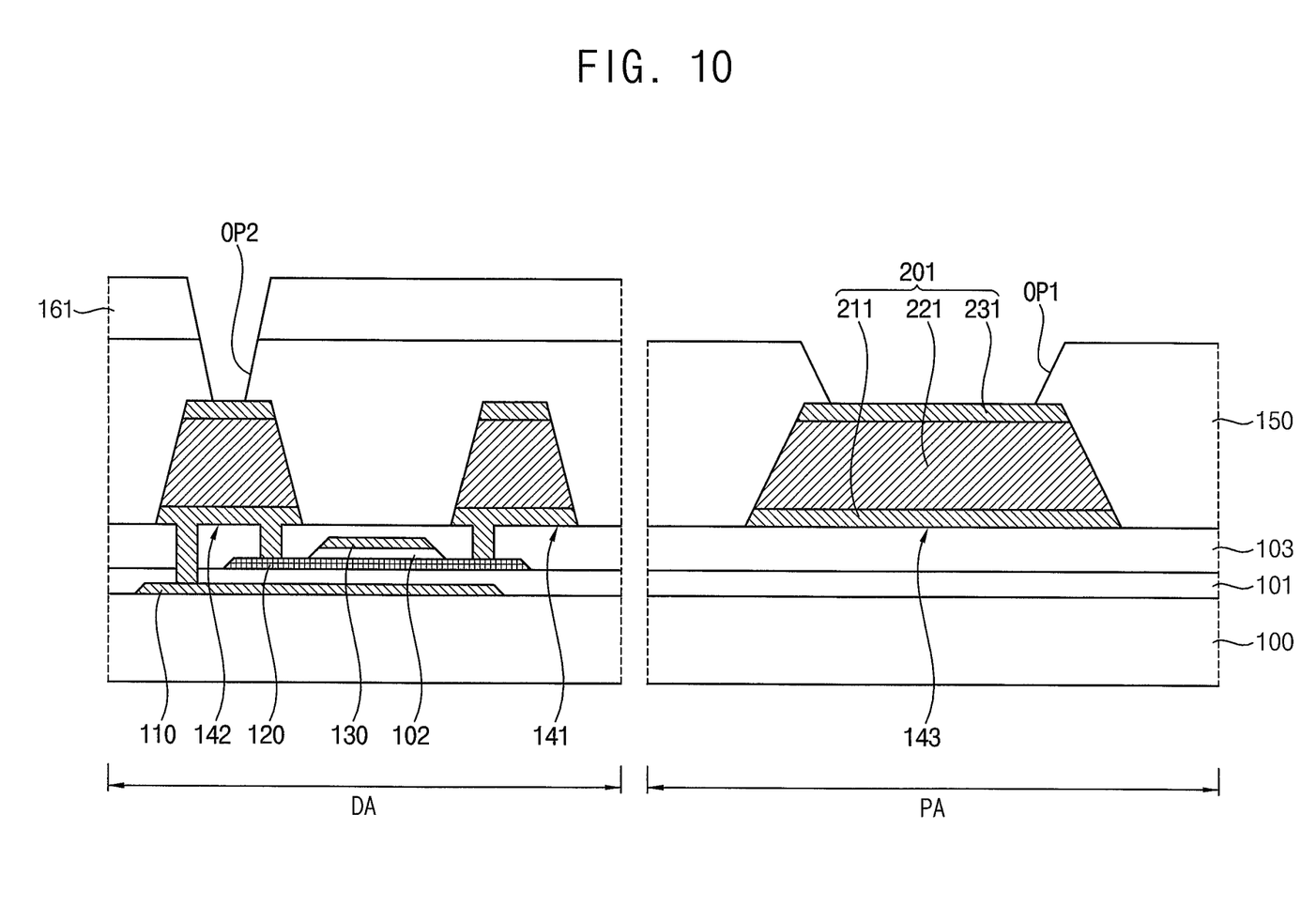

Referring to FIG. 10, the protective layer 150 covering the sidewall of the conductive pattern 201 may be formed on the substrate 100.

First, an inorganic insulating material such as silicon nitride, silicon oxide, silicon oxynitride, and/or the like may be deposited on the conductive pattern 201 to form the protective layer 150 covering the conductive pattern 201. Further, an organic insulating material such as polyimide (PI) and/or the like may be coated on the protective layer 150 in the display area DA to form the planarization layer 161. Then, the openings OP1 and OP2 exposing the upper surface of the conductive pattern 201 may be formed on the protective layer 160 using a photolithography process. Accordingly, the protective layer 150 may cover the sidewall of the conductive pattern 201.

Figure 11:
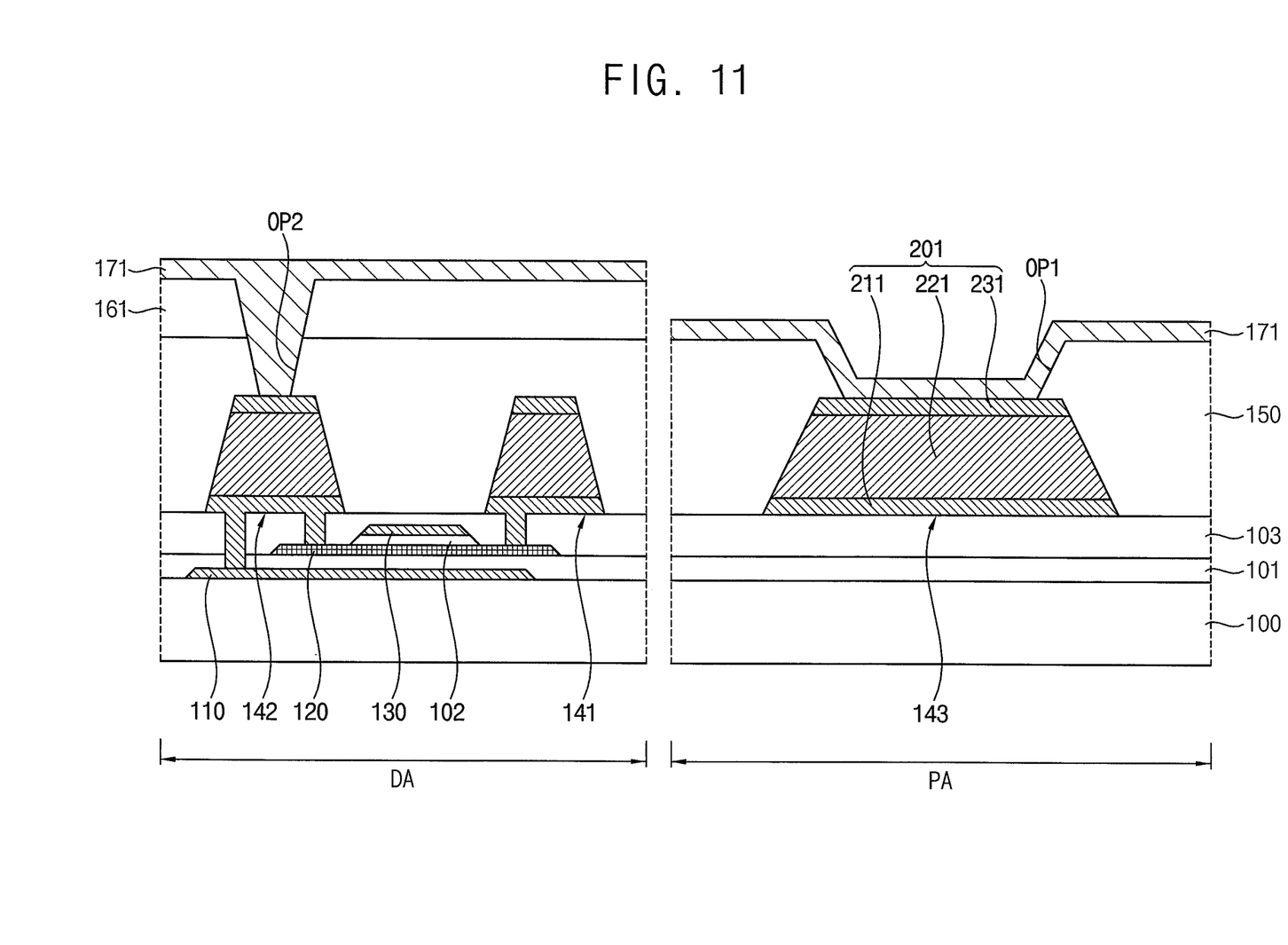
Figure 12:
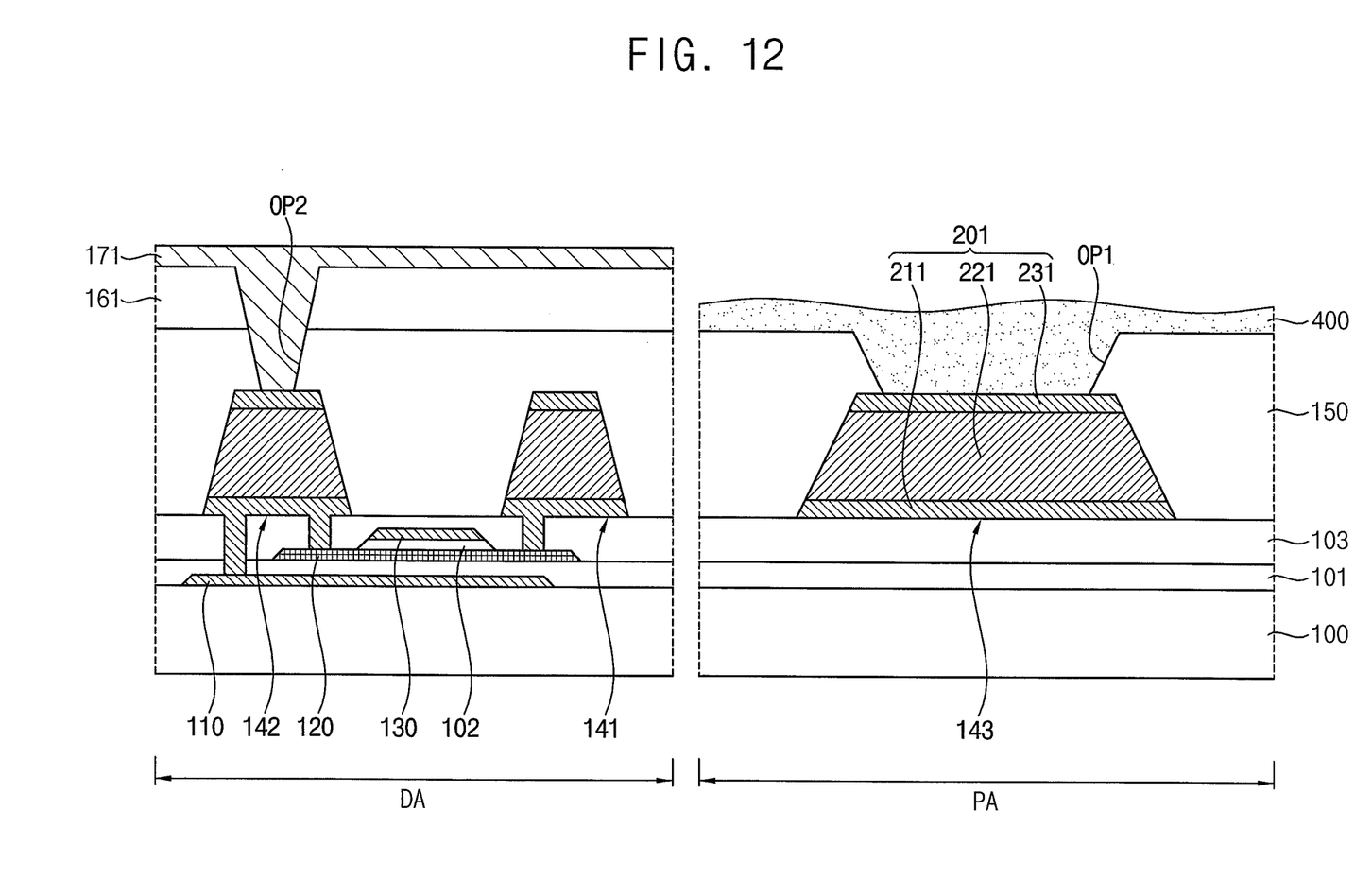

Referring to FIGS. 11 and 12, the display element DE in FIG. 3 may be formed on the protective layer 150.

First, an electrode layer 171 may be formed on the protective layer 150.

A conductive material such as metal, transparent conductive oxide, and/or the like may be deposited on the protective layer 150 to form the electrode layer 171 filling (e.g., extending through) the openings OP1 and OP2 of the protective layer 150. The electrode layer 171 may contact (e.g., physically contact) the upper surface of the conductive pattern 201 through the openings OP1 and OP2.

Then, the electrode layer 171 may be patterned by an etchant 400 to form the pixel electrode 170.

In an embodiment, the third layer 231 of the conductive pattern 201 may not be etched by the etchant 400. In other words, titanium (Ti) may not be etched by the etchant 400. Copper (Cu) may be etched by the etchant 400. If the second layer 221 of the conductive pattern 201 contacts (e.g., physically contacts) the etchant 400, the second layer 221 of the conductive pattern 201 may be etched by the etchant 400.

When the fourth layer 241 of the conductive pattern 201 is not removed before forming the protective layer 150, the fourth layer 241 of the conductive pattern 201 may be etched by the etchant 400 in the process of patterning the electrode layer 171 by the etchant 400, and thus, a space through which the etchant 400 can be permeated may be formed between a lower surface of a portion of the protective layer 150 covering the conductive pattern 201 and an upper surface of the third layer 231 of the conductive pattern 201. In this case, the etchant 400 permeated through the space may contact (e.g., physically contact) the second layer 221 of the conductive pattern 201, therefore, the second layer 221 of the conductive pattern 201 may be damaged.

However, in embodiments of the present disclosure, the fourth layer 241 of the conductive pattern 201 may be removed before forming the protective layer 150, so that the space through which the etchant 400 can be permeated may not be formed between the lower surface of the portion of the protective layer 150 covering the conductive pattern 201 and the upper surface of the third layer 231 of the conductive pattern 201. Because the etchant 400 is not permeated between the lower surface of the portion of the protective layer 150 covering the conductive pattern 201 and the upper surface of the third layer 231 of the conductive pattern 201 in the patterning of the electrode layer 171 by the etchant 400, the etchant 400 may not contact (e.g., physically contact) the second layer 221 of the conductive pattern 201, and thus, the second layer 221 of the conductive pattern 201 may not be damaged by the etchant 400.

In a comparative display device, conductive layers may be patterned using a photolithography process, an etching process, and/or the like after forming the conductive layers to form a conductive pattern, and a tip and/or the like may be formed in the conductive pattern when etching rates of the conductive layers with an etchant used in the etching process are different from each other. Further, in a comparative method of manufacturing a display device, various etchants may be used in the forming of conductive layers, insulation layers, and/or the like, and the conductive pattern may be damaged when the etchants are permeated through a space between the layers.

However, a tip may not be formed in the conductive pattern of the display device according to embodiments of the present disclosure, therefore, damage of the display device by the tip of the conductive pattern may be minimized or reduced, and the display device having an improved reliability may be provided. Further, in a method of manufacturing the display device according to the embodiments of the present disclosure, a space through which an etchant is permeated may not be formed between an upper surface of the conductive pattern and a lower surface of a portion of the protective layer covering the conductive pattern, and thus, the conductive pattern may not be damaged (or may not be noticeably damaged) by the etchant.

The display device according to the embodiments may be applied to a display device included in a computer, a notebook, a mobile phone, a smartphone, a smart pad, a PMP, a PDA, an MP3 player, and/or the like.

Although the display device and the method of manufacturing the display device according to embodiments of the present disclosure have been described with reference to the drawings, the illustrated embodiments are examples, and may be modified and changed by a person having ordinary knowledge in the relevant technical field without departing from the technical spirit described in the following claims, and equivalents thereof.

What is claimed is:

1. A method of manufacturing a display device, the method comprising:
   sequentially forming a first conductive layer, a second conductive layer comprising copper (Cu), a third conductive layer, and a fourth conductive layer on a substrate;
   patterning each of the first conductive layer, the second conductive layer, the third conductive layer, and the fourth conductive layer to form a conductive pattern including a first layer, a second layer, a third layer, and a fourth layer sequentially on the substrate, after sequentially forming the first to fourth conductive layers;
   removing the entire fourth layer of the conductive pattern;
   forming a protective layer covering at least a sidewall of the conductive pattern on the substrate; and
   forming a display element on the protective layer.

2. The method of claim 1, wherein patterning of each of the first conductive layer, the second conductive layer, the third conductive layer, and the fourth conductive layer comprises:
   forming a photoresist pattern on the fourth conductive layer;
   etching each of the first conductive layer, the second conductive layer, the third conductive layer, and the fourth conductive layer with an etchant using the photoresist pattern as an etching mask; and
   stripping the photoresist pattern.

3. The method of claim 2, wherein an etching rate of the third conductive layer with the etchant is less than an etching rate of the second conductive layer with the etchant and an etching rate of the fourth conductive layer with the etchant.

4. The method of claim 1, wherein a sidewall of the third layer of the conductive pattern does not protrude from a sidewall of the second layer of the conductive pattern and a sidewall of the fourth layer of the conductive pattern.

5. The method of claim 1, wherein the fourth layer of the conductive pattern is removed by a wet etching process.

6. The method of claim 1, wherein the fourth layer of the conductive pattern is removed by a chemical mechanical polishing/planarization.

7. The method of claim 1, wherein a portion of the protective layer covering the sidewall of the conductive pattern has an opening.

8. The method of claim 1, wherein the protective layer has an opening exposing an upper surface of the conductive pattern, and
wherein forming the display element comprises:
forming an electrode layer that extends through the opening of the protective layer on the protective layer; and
patterning the electrode layer with an etchant to form a pixel electrode.

9. The method of claim 8, wherein the third layer of the conductive pattern is not etched by the etchant.

10. The method of claim 1, wherein the first conductive layer comprises titanium (Ti).

11. The method of claim 1, wherein the third conductive layer comprises titanium (Ti).

12. The method of claim 11, wherein the fourth conductive layer comprises copper (Cu).

13. The method of claim 1, wherein a thickness of the second conductive layer is in a range from 10000 Å to 12000 Å.

14. A display device, comprising:
a substrate;
a conductive pattern comprising a first layer, a second layer comprising copper (Cu), and a third layer sequentially on the substrate;
a protective layer on the conductive pattern; and
a display element on the protective layer,
wherein the third layer does not protrude from the second layer at a sidewall of the conductive pattern,
wherein the protective layer physically contacts each of the first layer, the second layer, and the third layer, and
wherein an entire upper surface of the first layer is flat.

15. The display device of claim 14, wherein the first layer of the conductive pattern comprises titanium (Ti).

16. The display device of claim 14, wherein the third layer of the conductive pattern comprises titanium (Ti).

17. The display device of claim 14, wherein a thickness of the second layer of the conductive pattern is in a range from 10000 Å to 12000 Å.

18. The display device of claim 14, wherein the protective layer covers at least a sidewall of the conductive pattern, and
wherein a portion of the protective layer covering the sidewall of the conductive pattern has an opening.

19. The display device of claim 14, wherein a transistor providing a driving current to the display element is between the substrate and the protective layer, and
wherein the conductive pattern is a source electrode or a drain electrode of the transistor.

20. The display device of claim 14, wherein a transistor providing a driving current to the display element is between the substrate and the protective layer, and
wherein the conductive pattern is a pad electrically coupled to a flexible printed circuit to provide a signal or a power to the transistor.

* * * * *